United States Patent [19]

Lazenby et al.

[11] Patent Number: 5,065,279
[45] Date of Patent: Nov. 12, 1991

[54] INTEGRAL PROTECTIVE ENCLOSURE FOR TAB OR SIMILAR DELICATE ASSEMBLY MOUNTED LOCALLY ON A FLEXIBLE PRINTED CIRCUIT BOARD

[75] Inventors: Kate Lazenby; Allen R. Cox, both of Chandlers Ford, England

[73] Assignee: International Business Machines Corporation, Armonk, N.Y.

[21] Appl. No.: 568,111

[22] Filed: Aug. 16, 1990

[30] Foreign Application Priority Data

Sep. 9, 1989 [GB] United Kingdom ............... 89204521

[51] Int. Cl.⁵ .............................................. H05H 7/20
[52] U.S. Cl. ..................................... 361/386; 357/79; 357/81; 361/388; 361/398; 361/417
[58] Field of Search ............... 165/803, 185; 174/16.3; 357/80, 81, 79; 361/386–389, 398, 417, 419, 420

[56] References Cited

U.S. PATENT DOCUMENTS

| | | | |
|---|---|---|---|
| 4,387,413 | 6/1983 | Griffis | 361/386 |
| 4,504,886 | 3/1985 | Cygan et al. | 361/386 |
| 4,731,693 | 3/1988 | Berg et al. | 357/81 |

FOREIGN PATENT DOCUMENTS

| | | |
|---|---|---|
| 0103067 | 5/1983 | European Pat. Off. . |
| 0116396 | 5/1984 | European Pat. Off. . |

*Primary Examiner*—Gregory D. Thompson
*Attorney, Agent, or Firm*—Joscelyn G. Cockburn

[57] ABSTRACT

Described is a flexible electrical assembly comprising a TAB device mounted on one surface of a flexible printed circuit board, a heat sink with a set of crimping members thereon mounted on an opposite surface of the printed circuit board and a protective cover with attachment holes therein positioned above the TAB device. The protective cover is mounted so that the holes are aligned with similar ones in the printed circuit board. The crimping members are inserted through the holes and are folded onto the protective cover to form a unified structure.

10 Claims, 3 Drawing Sheets

INTEGRAL PROTECTIVE ENCLOSURE FOR TAB OR SIMILAR DELICATE ASSEMBLY MOUNTED LOCALLY ON A FLEXIBLE PRINTED CIRCUIT BOARD

BACKGROUND OF THE INVENTION

1. Field of the Invention

The present invention relates to a provision of mechanical protection for a Tape Automated Bonding (TAB) device mounted on a flexible printed circuit board (PCB) during assembly and life. For the purpose of the following description and claims, a TAB device refers to a TAB or similarly delicate electrical device assembly.

2. Prior Art

Such protection has additional heat conducting properties to assist heat dissipation from the TAB device. A problem associated with a flexible electrical assembly including a TAB device concerns mechanical failure of delicate, electrical between the flexible circuit board and the device. These connections can be easily damaged or broken during post manufacturing processes in which the flexible characteristic of the flexible electrical assembly is not restrained. Similar breakages can also occur where the flexible characteristics of such an assembly are exercised as part of the normal installation and operation of a product.

Another problem associated with a flexible electrical assembly including a TAB device concerns the removal of heat energy generated by the TAB device whilst retaining the flexible characteristic of the flexible electrical assembly.

EPA 103067 describes a method by which a multiplicity of integrated circuit modules mounted on flexible circuit board can be cooled. The modules are orientated so that the top surface of each makes contact with a common planar surface which is part of a cooling plate. A coefficient of thermal conductivity between the cooling plate and each module is minimised by maximising associated areas of contact with thermally conductive lubricant. A pressure means, acting upon the flexible circuit board is directed to press the modules and the flexible circuit board toward the common cooling plate.

Whilst application to TAB technology is feasible, a problem with this arrangement is that no protection against mechanical failure is provided for TAB connections during manufacture of an electrical assembly. Furthermore, the flexible characteristic of the circuit board cannot be realised in such an electrical assembly.

Another approach, described by EPA, 116,396, provides a similar cooling system whereby a slab like heatsink material has raised pillars which protrude through holes in the flexible circuit board and make thermal contact with the flat undersides of integrated circuit modules mounted on the circuit board.

Good thermal contact to TAB devices cannot however be achieved in this manner. Furthermore, as described in the previous example, a common clamping format is suggested for maintaining good thermal contact between the heatsink and the modules by which means the flexible characteristics of the flexible electrical assembly are restricted.

SUMMARY OF THE INVENTION

Accordingly, the present invention provides, a flexible electrical assembly comprising a TAB device mounted on a one side of a flexible circuit board, an array of printed electrical connections which may extend on either side of the circuit board in order to connect terminals of the device to terminals of other devices mounted on the circuit board, an individual heatsink having locating means for mounting the heatsink on a different side of the flexible circuit board to that on which the device is mounted, characterised in that the device is rigidly enclosed between the heatsink and a cover utilising the locating means of the heatsink for attachment to a side of the flexible circuit board on which the device is attached, in order to provide mechanical protection of the device. A mechanically protective enclosure for a TAB device mounted on a flexible circuit board is therefore provided comprising two portions in which a first portion is a punched, formed metal heatsink having locating means, for mounting the heatsink on the flexible circuit board, comprising a plurality of tabs, and a second, protective cover portion which is a resilient moulding having locating means which are receptive to said tabs.

The advantage of this arrangement is that the TAB device is bonded directly to the heatsink, to optimise thermal conductivity, by a process, involving only two mechanical parts, which subsequently become part of a mechanically protective assembly enclosing the TAB device. Furthermore the simplicity of this assembly is attractive for automated production and therefore low manufacturing cost. The heatsink has an open structure, for ease of cleaning, with no traps for contaminants which can lead to insulation resistance failure via dendritic growth between adjacent electrical connections.

In a particularly preferred embodiment, the area of the flexible circuit board occupied by the heatsink is similar to the area of the flexible circuit board occupied by the protective cover so that a plurality conductive wires which connect the device to the array of connections printed on the flexible circuit board are mechanically protected. This has the advantage that the flexible electrical assembly is thereby protected against failure modes which result from shock and vibrational forces.

By another aspect of the invention, the protective cover incorporates a preloaded member which defines a thickness of a film of thermally conductive adhesive compound interposed between the device and the heatsink during a bonding process. This has the advantage that there is no requirement for additional fixture complexity during the manufacture of a TAB electrical assembly in which the TAB device is bonded to a heatsink.

BRIEF DESCRIPTION OF THE DRAWINGS

A particular embodiment of the invention will now be described with the aid of the following diagrams in which.

DETAILED DESCRIPTION

Figure 1:
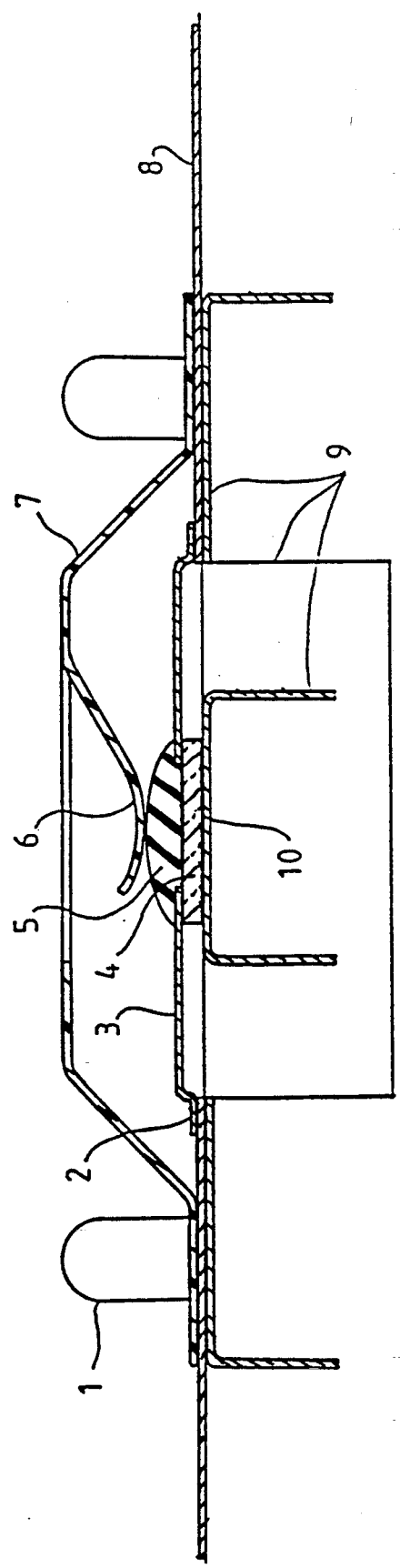
FIG. 1 is a cross sectional view of a flexible electrical assembly comprising TAB device, protective cover, and heatsink, mounted on a flexible circuit board.

As shown in FIG. 1, a TAB device (3) includes a silicon chip (4), an encapsulant seal (5) to protect electrical connections to the chip, and an array of TAB outer leaf electrical connections (2) from the chip. These outer leaf connections are delicate and can be damaged during manufacturing processes.

A heatsink (9), compatible with the TAB device, initially punched out of a metal sheet. A suitable metal for this purpose is aluminium. The heatsink is subsequently formed to provide a thermal contact area (11), shown in FIG. 2, for making thermal contact with an exposed surface of the TAB device via a thin layer of thermally conductive adhesive (10). Furthermore, the heatsink includes heat dissipating fins for removing heat from the TAB device, and a set of crimping leaves (1) for securing the heatsink to both one side of a flexible circuit board (8) and a protective plastic cover (7).

The protective plastic cover includes a moulded-in spring (6) to pressurise the adhesive between the heatsink and the chip surface before the adhesive cures. This optimises a thermal bond between the heatsink and the chip.

Figure 2:
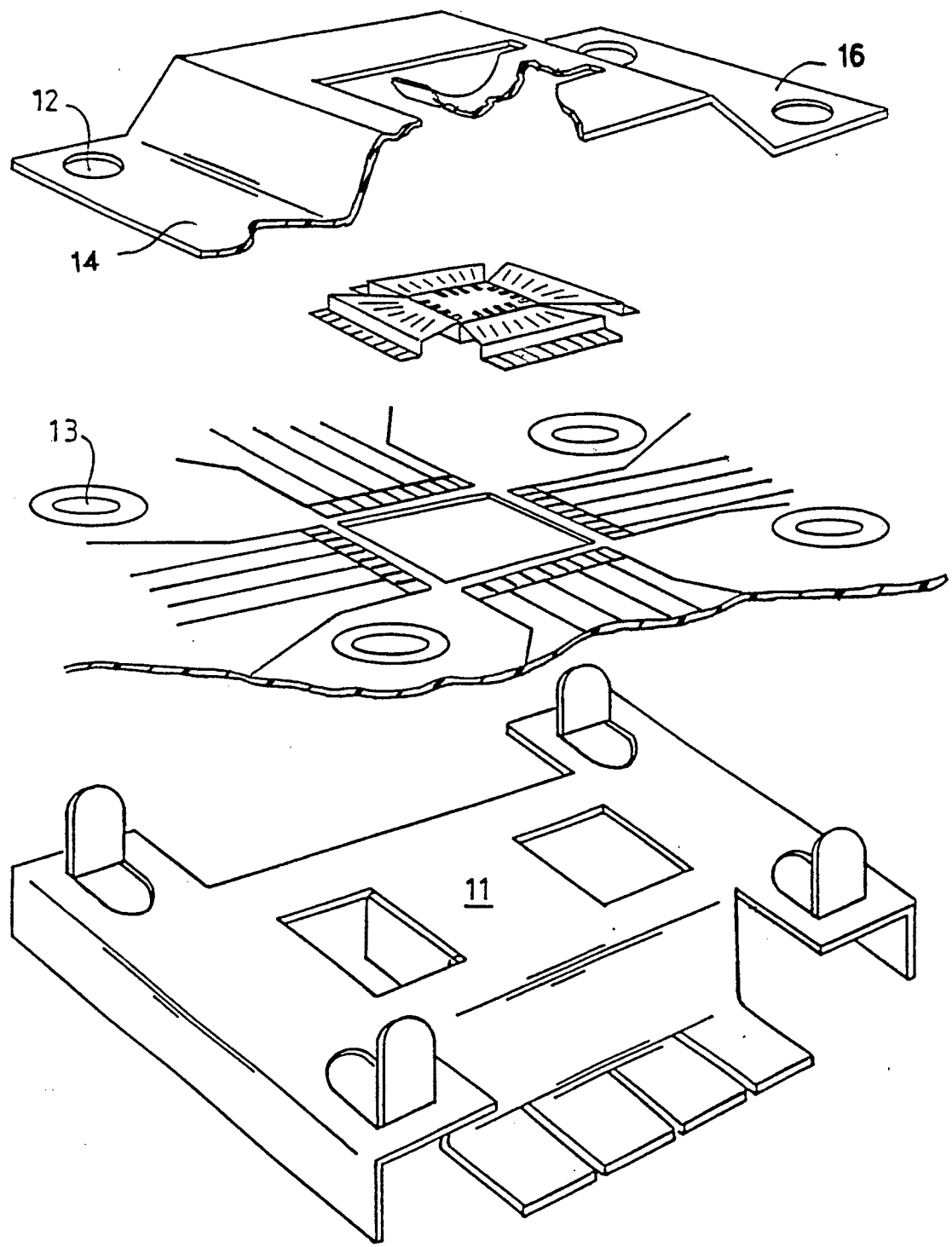
FIG. 2 is a perspective drawing which further illustrates the flexible electrical assembly shown in FIG. 1.

FIG. 2 illustrates the order in flanges or tabs 14 and 16 of which the heatsink, TAB device, flexible circuit board and protective cover are assembled. Receptive holes (12) in the protective cover align with the crimping leaves of the heatsink. The flexible circuit board contains locating holes (13) through which the crimping leaves pass, prior to passing through the aforementioned receptive holes. The assembled combination of the heatsink, the flexible circuit material, and the protective cover enclosing the device is thereby secured by splaying the protruding crimping leaves against the protective cover.

Figure 3:
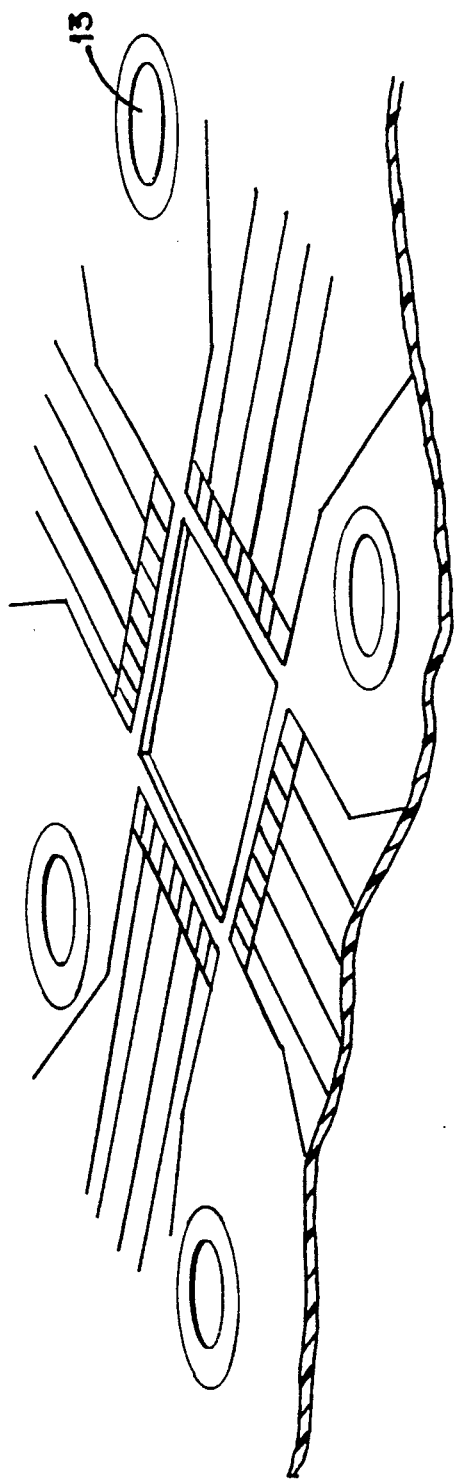
FIG. 3 is a perspective view illustrating the opposite surface of the flexible printed circuit board, the other surface of which is shown in FIG. 2.

FIG. 3 shows a schematic of the other surface of the printed circuit board 8. The other surface is identical to the surface shown in FIG. 2. The other surface includes locating holes 13a and printed circuit lands or conductors connected to the printed circuit terminals. Appropriate insulating areas (not shown) separate the printed circuit terminals to prevent short circuit conditions.

We claim:

1. A flexible electrical assembly comprising:
   a flexible circuit board (8) having an array of printed electrical connections thereon for interconnecting devices mounted on the circuit board;
   a TAB device (3) mounted on a first surface of the flexible circuit board;
   heatsink (9) having positioning and attaching means (11) which positions and mounts said heatsink on a second surface of said flexible circuit board, with said heatsink being in contact with said TAB device; and
   a protective cover (7) positioned in spaced relationship with the TAB device, said protective cover having receptacles (12) therein for aligning with similar receptacles (13) in said flexible circuit board, said receptacles receiving the attaching means (11) which is fixed onto the protective cover to form a unified structure.

2. The flexible electrical assembly of claim 1 further including a layer of thermally conductive adhesive (10) inserted between a surface of the heat sink and a surface of the TAB device during a bonding process.

3. The flexible electrical assembly of claim 1 wherein the protective cover includes molded plastic with a molded-in spring for the preloaded member.

4. The flexible electrical assembly of claim 1 wherein the array of printed electrical connections are placed on either surface of the flexible circuit board.

5. A flexible electrical assembly as claimed in claim 1 wherein an area of the flexible circuit board covered by the heat sink (9) is similar to an area of the flexible circuit board covered by the protective cover (7) so that plurality conductive wires (2) which connect the TAB device (3) to the array of connections printed on the flexible circuit board are mechanically protected.

6. A flexible electrical assembly as claimed in claim 2 in which the protective cover incorporates a preloaded member which contacts the TAB device and forces it with a force that causes excessive amount of thermally conductive adhesive to be squeezed out thus leaving a film of thermally conductive adhesive whose thickness is defined by the force of said preloaded member.

7. A flexible electrical assembly as claimed in claim 5 wherein the heatsink is punched from a larger sheet of metal and formed to comprise the plurality of tabs, a plurality of heat dissipating fins, and a device bonding area to facilitate heat transfer from a surface of the device to the heatsink.

8. A flexible electrical assembly as claimed in claim 3 wherein the flexible circuit board remains flexible on areas exterior to a protective enclosure formed by the protective cover (7) and the heatsink (9) and substantially rigid on the interior of the protective enclosure.

9. A flexible electrical assembly as claimed in claim 8 whereby a plurality of locating holes in the flexible circuit board permit the heatsink to be secured to the protective cover tabs via mechanical splaying of the tabs.

10. An assembly protecting a TAB device (3) mounted on a flexible circuit board (8) comprising:
    a first portion in the form of a metal heat sink (9) having locating means for positioning and mounting the heat sink (9) on one surface of the circuit board; and
    a second portion in the form of a protective cover (7) having a mold-in spring (6) which contacts the TAB device and forces it onto the first portion and holes for aligning with similar holes in the flexible circuit board, the holes receiving the locating means which is splayed to secure the heat sink to the flexible circuit board and the protective cover.

* * * * *